United States Patent [19]

Wright

[11] Patent Number: 4,788,124

[45] Date of Patent: Nov. 29, 1988

[54] THERMAL RECORDING METHOD AND MATERIAL

[75] Inventor: Richard F. Wright, Dayton, Ohio

[73] Assignee: The Mead Corporation, Dayton, Ohio

[21] Appl. No.: 86,853

[22] Filed: Aug. 19, 1987

[51] Int. Cl.$^4$ .......................... G03C 1/00; G03C 1/40; G03C 1/727; G03C 5/00

[52] U.S. Cl. ..................... 430/138; 428/211; 428/402.2; 430/203; 430/235; 430/254; 430/270; 430/338; 430/340; 430/341; 430/348; 430/349; 430/914

[58] Field of Search ............... 430/138, 211, 235, 254, 430/203, 348, 349, 340, 341, 914, 338, 270; 428/211, 402.2

[56] References Cited

U.S. PATENT DOCUMENTS

| | | | |
|---|---|---|---|
| 3,567,453 | 3/1971 | Borden et al. | 430/95 |
| 4,307,182 | 12/1981 | Dalzell et al. | 430/270 |
| 4,343,891 | 8/1982 | Aasen et al. | 430/337 |
| 4,399,209 | 8/1983 | Sanders et al. | 430/138 |
| 4,447,521 | 5/1984 | Tiers et al. | 430/337 |
| 4,450,227 | 5/1984 | Holmes et al. | 430/339 |
| 4,500,624 | 2/1985 | Aono et al. | 430/138 |
| 4,562,137 | 12/1985 | Sanders | 430/138 |
| 4,576,891 | 3/1986 | Adair et al. | 430/138 |
| 4,622,282 | 11/1986 | Head et al. | 430/138 |
| 4,689,286 | 8/1987 | Schranz et al. | 430/138 |
| 4,701,397 | 10/1987 | Rourke et al. | 430/138 |

FOREIGN PATENT DOCUMENTS 6260694 10/1982 Japan .

*Primary Examiner*—Mukund J. Shah
*Attorney, Agent, or Firm*—Smith & Schnacke

[57] ABSTRACT

An imaging process which comprises image-wise simultaneously exposing to heat and light or ultraviolet radiation an imaging material comprising a support having a layer of photosensitive microcapsules on the surface thereof, said microcapsules containing an internal phase including an image-forming agent and a photosensitve composition which undergoes a change in viscosity, melting point, softening point to heat and light or ultraviolet radiation but which remains essentially unchanged in the presence of either heat or light or ultraviolet radiation alone; assembling said imaging material with an image-receiving sheet and subjecting the assembly to a uniform transfer force such that said image-forming agent is image-wise transferred to said imaging material; wherein said photohardenable composition includes a free radical addition polymerizable or crosslinkable compound and an ionic dye-reactive counter ion compound, said ionic dye-reactive counter ion compound, said ionic dye-reactive counter ion compound being capable of absorbing light and producing free radicals which initiate free radical polymerization or crosslinking of said polymerizable or crosslinkable material in the presence of heat.

14 Claims, No Drawings

THERMAL RECORDING METHOD AND MATERIAL

BACKGROUND OF THE INVENTION

The present invention relates to an improved thermal recording method.

Published Japanese Application No. 62-60694 discloses a thermal recording method employing an imaging material of the type described in U.S. Pat. No. 4,399,209. This imaging material includes a layer of photosensitive microcapsules which is carried on a support. The internal phase of the microcapsule includes a photosensitive composition and an image-forming agent and possesses a temperature (the glass transition temperature) above which the composition must be heated before it will react efficiently in the presence of light or ultraviolet radiation.

In accordance with the teachings of Japanese published application No. 62-60694, images are prepared by image-wise heating the aforementioned imaging material while the imaging material is simultaneously exposed to light or ultraviolet radiation. In the areas in which the material is heated, the melting point, softening temperature or glass transition temperature is increased by the exposure as a result of photopolymerization of the internal phase. In areas in which the imaging material is not heated, the simultaneous exposure to light or ultraviolet radiation has little or no effect on the physical characteristics of the internal phase. Accordingly, when the exposed medium is assembled with an image-receiving sheet and heated to a temperature above its original melting, softening or glass transition temperature, the internal phase is released from the microcapsules only in the areas which are not photohardened.

In accordance with one of the embodiments discribed in Japanese Patent No. 62-60694, full color images are obtained using a combination of microcapsules containing different image-forming agents such as cyan, magenta, yellow and black image-forming agents and photohardenable compositions which are principally sensitive to different bands of actinic radiation. In this manner, the imaging material can be image-wise heated using a thermal print head controlled by an image processing signal and the microcapsules containing the different image-forming agents can be selectively hardened as a function of their combined exposure to heat and radiation of the selected wavelength.

The imaging materials described in the Japanese publication are false color systems. For example, in one embodiment, the cyan, magenta, yellow and black producing microcapsules contain photoinitiator systems having light absorption bands of 280-340 nm, 340-380 nm, 380-450 nm and 450-600 nm, respectively.

SUMMARY OF THE INVENTION

The present invention relates to an improvement in the thermal recording method described in the aforementioned Japanese publication. In accordance with the present invention, ionic dye-counter ion complexes are used as photoinitiators in the photohardenable compositions described in the Japanese publication. In this manner, visible light sources can be used in the method.

Accordingly, the present invention resides in an imaging process which comprises image-wise simultaneously exposing to heat and light or ultraviolet radiation an imaging material comprising a support having a layer of photosensitive microcapsules on the surface thereof, said microcapsules containing an internal phase including an image-forming agent and a photosensitive composition which undergoes a change in viscosity, melting point, softening point or glass transition point when simultaneously exposed to heat and light or ultraviolet radiation but which remains essentially unchanged in the presence of either heat or light or ultraviolet radiation alone; assembling said imaging material with an image-receiving sheet and subjecting the assembly to a uniform transfer force such that said image-forming agent is image-wise transferred to said imaging material; wherein said photohardenable composition includes a free radical addition polymerizable or crosslinkable compound and an ionic dye-reactive counter ion compound, said ionic dye-reactive counter ion compound being capable of absorbing light and producing free radicals which initiate free radical polymerization or crosslinking of said polymerizable or crosslinkable material.

The present invention also resides in a photosensitive material comprising a support having a layer of microcapsules on one surface thereof, said microcapsules having an image-forming agent associated therewith and containing an internal phase including a composition which hardens upon exposure to heat and light but which is not hardened upon exposure to either heat or light alone, said composition comprising a free radical addition polymerizable or crosslinkable material and an ionic dye-reactive counter ion compound, said ionic dye-reactive counter ion compound being capable of absorbing light and producing free radicals which initiate free radical polymerization or crosslinking of said polymerizable or crosslinkable compound.

In accordance with a preferred embodiment of the present invention, the ionic dye-counter ion compound is a cationic dye-borate compound or a xanthene dye-onium compound.

DETAILED DESCRIPTION OF THE INVENTION

The image-forming agents used in the present invention include dyes, pigments and leuco dyes. In view of the light sensitivity of the photohardenable compositions used in the present invention, the image-forming agent is preferably not a dye or pigment but a leuco dye. Typical examples of leuco dyes useful in the present invention are described in British Patent No. 2113860.

Photohardenable compositions useful in the present invention typically include an ethylenically unsaturated monomer or oligomer or a crosslinkable prepolymer and a crosslinking agent. Typical examples of polymerizable monomers useful in the present invention are: methyl acrylate, methyl methacrylate, cyclohexyl acrylate, benzyl acrylate, acrylamide, N-methylol acrylamide, N-diacetone acrylamide, styrene, acrylonitrile, vinyl acetate, ethylene glycol diacrylate, butylene glycol dimethacrylate, 1,4-butanediol diacrylate or 1,6-hexanediol dimethacrylate.

Typical examples of polymerizable oligomers are: diethylene glycol diacrylate, triethylene glycol diacrylate, polyethylene glycol diacrylate, polyethlene glycol dimethacrylate or polypropylene glycol diacrylate.

- Typical examples of crosslinking agents are: ethylene glycol diacrylate, propylene glycol diacrylate, ethylene glycol dimethacrylate, 1,4-butanediol diacrylate or an N,N-methylene bisacrylamide such as tri(6-acryloyloxyhexyl)-1,3,5-benzenetricarboxylate, polyvinyl cinnamate, p-methoxycinnamate-succinic acid half ester, or polymethyl vinyl ketone.

Typical examples of crosslinkable prepolymers are: epoxy resin, unsaturated polyester resin, polyurethane resins, polyvinyl alcohol resin, polyamide resin, polyacrylic acid resin, polymaleic acid resin or silicone resin such as poly[4,4'-isopropylidenediphenylene-1,1,3-trimethyl-3-phenylindane-5,4'-dicarboxylate co-azelate] (25:75).

When desirable, the following polymers may be added to the photosensitive composition: cellulose acetate, succinate, and methyl methacrylate-hydroxyethyl methacrylate copolymer.

Cationic dye-borate anion compounds are known in the art. Their preparation and use in imaging systems is described in U.S. Pat. Nos. 3,567,453; 4,307,182; 4,343,891; 4,447,521; and 4,450,227. The compounds used in the present invention can be represented by the general formula (I):

where $D^+$ is a cationic dye; and $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups.

Useful dyes form photoreducible but dark stable complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. In addition to being cationic, the dyes should not contain groups which would neutralize or desensitize the complex or render the complex poorly dark stable. Examples of groups which generally should not be present in the dye are acid groups such as free carboxylic or sulphonic acid groups.

Specific examples of useful cationic dyes are Methylene Blue, Safranine O, Malachite Green, cyanine dyes of the general formula (II) and rhodamine dyes of the formula (III):

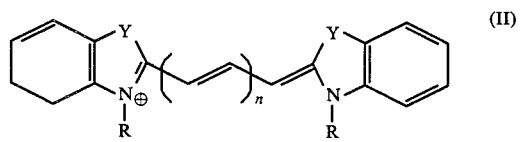

n=0, 1, 2, 3,
R=alkyl
Y=CH=CH, N—CH$_3$, C(CH$_3$)$_2$, O, S, Se

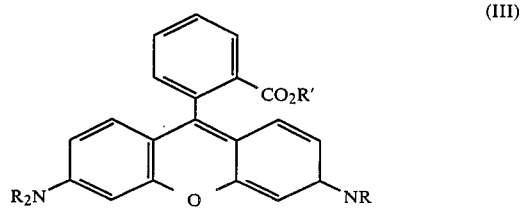

R', R=alkyl, aryl, and any combination thereof.

While they have not been tested, the cationic cyanine dyes disclosed in U.S. Pat. No. 3,495,987 should be useful in the present invention.

The borate anion is designed such that the borate radical generated upon exposure to light and after electron transfer to the dye (Eq. 1) readily dissociates with the formation of a radical as follows:

$$BR_4^- \rightarrow BR_3 + R\cdot \qquad (Eq.\ 2)$$

For example particularly preferred anions are triphenylbutylborate and trianisylbutylborate anions because they readily dissociate to triphenylborane or trianisylborane and a butyl radical. On the other hand tetrabutylborate anion does not work well presumably because the tetrabutylborate radical is not stable and it readily accepts an electron back from the dye in a back electron transfer and does not dissociate efficiently. Likewise, tetraphenylborate anion is very poor because the phenyl radical is not easily formed.

Preferably, at least one but not more than three of $R^1$, $R^2$, $R^3$, and $R^4$ is an alkyl group. Each of $R^1$, $R^2$, $R^3$, and $R^4$ can contain up to 20 carbon atoms, and they typically contain 1 to 7 carbon atoms. More preferably $R^1$-$R^4$ are a combination of alkyl group(s) and aryl group(s) or aralkyl group(s) and still more preferably a combination of three aryl groups and one alkyl group.

Representative examples of alkyl groups represented by $R^1$-$R^4$ are methyl, ethyl, propyl, butyl, pentyl, hexyl, octyl, stearyl, etc. The alkyl groups may be substituted, for example, by one or more halogen, cyano, acyloxy, acyl, alkoxy or hydroxy groups.

Representative examples of aryl groups represented by $R^1$-$R^4$ include phenyl, naphthyl and substituted aryl groups such as anisyl. Alkaryl groups include methylphenyl, dimethylphenyl, etc. Representative examples of aralkyl groups represented by $R^1$-$R^4$ groups include benzyl. Representative alicyclic groups include cyclobutyl, cyclopentyl, and cyclohexyl groups. Examples of an alkynyl group are propynyl and ethynyl, and examples of alkenyl groups include a vinyl group.

As a general rule, useful ionic dye compounds must be identified empirically, however, potentially useful dye and counter ion combinations can be identified by reference to the Weller equation (Rehm, D. and Weller, A., *Isr. J Chem.* (1970), 8, 259-271), which can be simplified as follows.

$$\Delta G = E_{ox} - E_{red} - E_{h\nu} \qquad (Eq.\ 3)$$

where $\Delta G$ is the change in the Gibbs free energy, $E_{ox}$ is the oxidation potential of the borate anion $BR_4^-$, $E_{red}$ is the reduction potential of the cationic dye, and $E_{h\nu}$ is the energy of light used to excite the dye. Useful compounds will have a negative free energy change. Similarly, the difference between the reduction potential of the dye and the oxidation potential of the borate must be negative for the compounds to be dark stable, i.e., Eox−Ered>O.

As indicated, Eq. 2 is a simplification and it does not absolutely predict whether a compound will be useful in the present invention or not. There are a number of other factors which will influence this determination. One such factor is the effect of the monomer on the compound. Another factor is the radial distance between the ions. It is also known that if the Weller equation produces too negative a value, deviations from the equation are possible. Furthermore, the Weller equation only predicts electron transfer, it does not predict whether a particular compound is an efficient initiator of polymerization. The equation is a useful first approximation.

Specific examples of cationic dye-borate anion compounds useful in the present invention are shown in the following table with their λ max.

TABLE

| Compound No. | Structure | λmax (TMPTA) |
|---|---|---|
| 1. | [structure with two benzothiazole groups connected via CH=C(CH₃)-CH= bridge, N-CH₂CH₃ substituents, Ph₃B⊖n-C₄H₉ counterion] | 552 nm |
| 2. | [structure with two benzothiazole groups connected via CH=CH-CH= bridge, N-C₇H₁₅ substituents, Ph₃B⊖n-C₄H₉ counterion] | 568 nm |
| 3. | [structure with two benzoxazole groups connected via CH=CH-CH= bridge, N-C₆H₁₃ substituents, Ph₃B⊖n-C₄H₉ counterion] | 492 nm |
| 4. | [structure with two benzothiazole groups connected via =CH- bridge, N-CH₃ substituents, Ph₃B⊖n-C₄H₉ counterion] | 428 nm |
| 5. | [phenothiazinium-type structure with (CH₂)N and N(CH₃)₂ substituents, Ph₃B⊖n-C₄H₉ counterion] | 658 nm |
| 6. | [phenazinium-type structure with CH₃, NH₂ substituents and N-phenyl, Ph₃B⊖n-C₄H₉ counterion] | 528 nm |
| 7. | [structure with two dihydrothiazole groups connected via CH=CH-CH= bridge, N-CH₂CH₂ and N-CH₂CH₃ substituents, Ar₃B⊖—R' counterion] | 450 nm |

| No. | R' | Ar |
|---|---|---|
| 7A | n-butyl | phenyl |
| 7B | n-hexyl | phenyl |

TABLE-continued

| | No. | | R' | | Ar |
|---|---|---|---|---|---|
| | 7C | | n-butyl | | anisyl |

8. 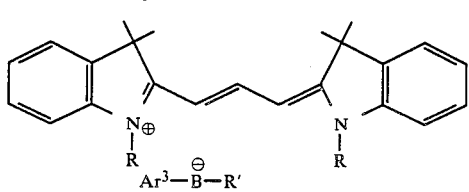 550 nm

| No. | R' | R | Ar |
|---|---|---|---|
| 8A | methyl | n-butyl | phenyl |
| 8B | methyl | n-hexyl | phenyl |
| 8C | n-butyl | n-butyl | phenyl |
| 8D | n-butyl | n-hexyl | phenyl |
| 8E | n-heptyl | n-butyl | phenyl |
| 8F | n-heptyl | n-hexyl | phenyl |
| 8G | ethyl | n-butyl | phenyl |

9. 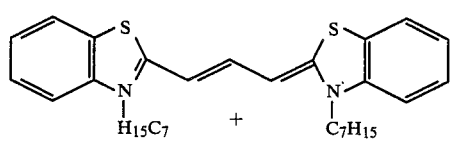 570 nm System

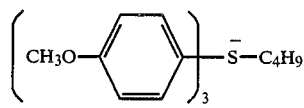

10. 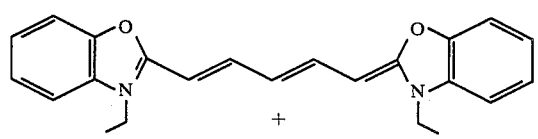 590 nm System

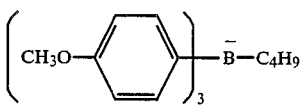

11. 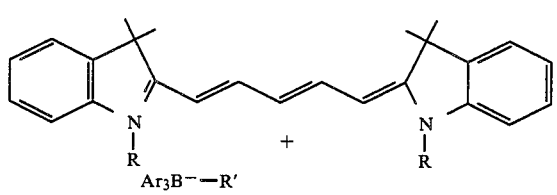 640 nm

| No. | R | R' | Ar |
|---|---|---|---|
| 11A | methyl | n-butyl | phenyl |
| 11B | methyl | n-hexyl | phenyl |
| 11C | n-butyl | n-butyl | phenyl |
| 11D | n-butyl | n-hexyl | phenyl |
| 11E | n-pentyl | n-butyl | phenyl |
| 11F | n-pentyl | n-hexyl | phenyl |
| 11G | n-heptyl | n-butyl | phenyl |
| 11H | n-heptyl | n-hexyl | phenyl |
| 11I | methyl | n-butyl | anisyl |

12. 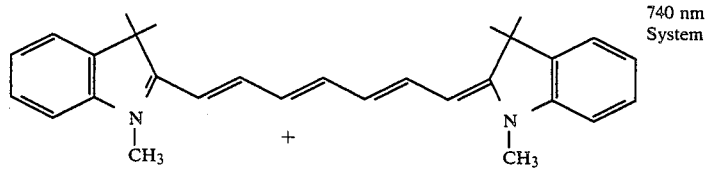 740 nm System

| TABLE-continued |
|---|
| 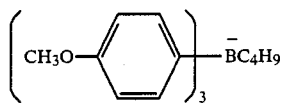 |

The cationic dye-borate anion compounds can be prepared by reacting a borate salt with a dye in a counterion exchange in a known manner. See Hishiki, Y., *Repts. Sci. Research Inst.* (1953), 29, pp 72–79. Useful borate salts are sodium salts such as sodium tetraphenylborate, sodium triphenylbutylborate, sodium trianisylbutylborate and ammonium salts such as tetraethylammonium tetraphenylborate.

Anionic dye compounds are also useful in the present invention. Anionic dye-iodonium ion compounds of the formula (IV):

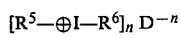 (IV)

where $D^-$ is an anionic dye and $R^5$ and $R^6$ are independently selected from the group consisting of aromatic nucleii such as phenyl or naphthyl and n is 1 or 2; and anionic dye-pyryllium compounds of the formula (V):

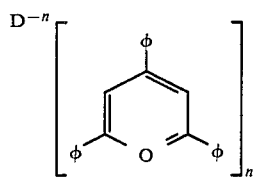 (V)

where $D^-$ and n are as defined above are typical examples of anionic dye complexes.

Representative examples of anionic dyes include xanthene and oxonol dyes. For example Rose Bengal, eosin, erythiosin, and fluorscein dyes are useful. In addition to iodonium and pyryllium ions, other compounds of anionic dyes and sulfonum and phosphonium cations are potentially useful.

As in the case of the cationic dye compounds, useful dye-cation combinations can be identified through the Weller equation as having a negative free energy.

Selected examples of anionic dye compounds are shown in Table 2 λ max. ca. 570 nm in TMPTA). In Table 2 the symbol φ is used for a phenyl group and the structure

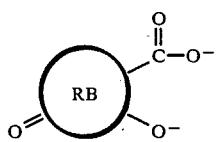

is used for

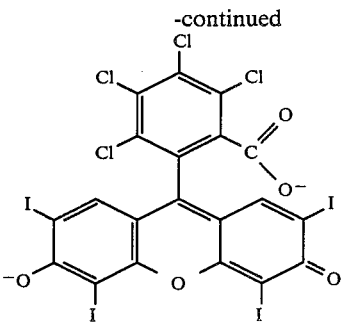

TABLE 2

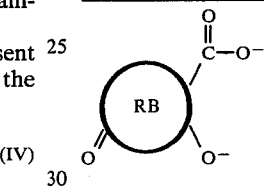 

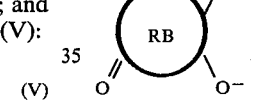

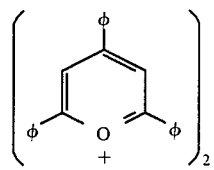

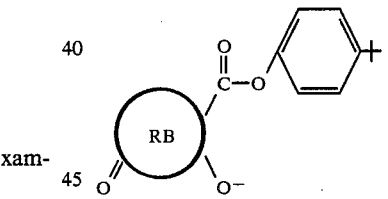

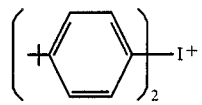

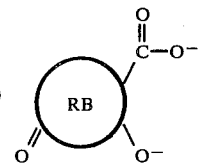

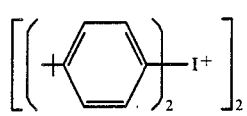

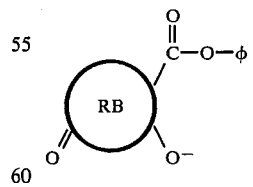

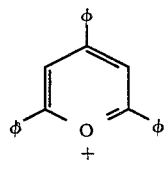

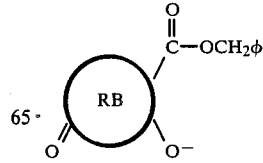

TABLE 2-continued

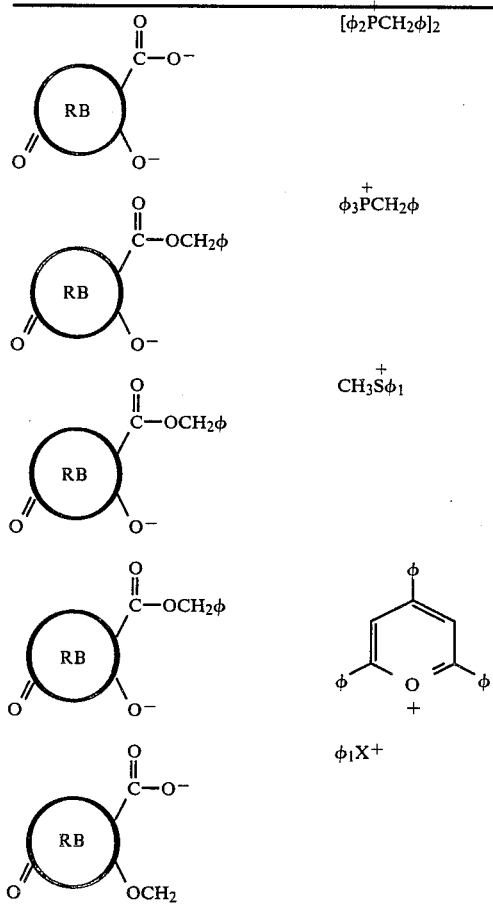

The ionic dye compound is usually used in an amount up to about 1% by weight based on the weight of the photopolymerizable or crosslinkable species in the photohardenable composition. More typically, the compound is used in an amount of about 0.2% to 0.5% by weight.

While the compound can be used alone as the initiator, film speeds tend to be quite low and oxygen inhibition is observed. It has been found that it is preferable to use the compound in combination with an autoxidizer. An autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or para- position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N, N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylthioanicidine, 4-amino- N,N-dimethylaniline, 3-hydroxy-N,N-dimethylaniline, N,N,N',N'-tetramethyl-1,4-dianiline, 4-acetamido-N, N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline (PMA) and p-t-butyl-N,N-dimethylaniline.

The autoxidizers are preferably used in the present invention in concentrations of about 4–5% by weight.

Having described the invention in detail and by reference to preferred embodiments thereof, it will be apparent that modifications and variations are possible without departing from the scope of the invention defined in the appended claims.

What is claimed is:

1. An imaging process which comprises image-wise simultaneously exposing to heat and light or ultraviolet radiation an imaging material comprising a support having a layer of photosensitive microcapsules on the surface thereof, said microcapsules containing an internal phase including an image-forming agent and a photosensitive composition which undergoes a change in viscosity, melting point, softening point or glass transition point when simultaneously exposed to heat and light or ultraviolet radiation but which remains essentially unchanged when exposed to either heat or light or ultraviolet radiation alone; assembling said imaging material with an image-receiving sheet and subjecting the assembly to a uniform transfer force such that said image-forming agent is image-wise transferred to said imaging material; wherein said photosensitive composition includes a free radical addition polymerizable or crosslinkable compound and an ionic dye-reactive counter ion compound, said ionic dye-reactive counter ion compound being capable of absorbing light and producing free radicals which initiate free radical polymerization or crosslinking of said polymerizable or crosslinkable material in the presence of heat.

2. The imaging process of claim 1 wherein said ionic dye-reactive counter ion compound is a cationic dye-borate anion complex represented by the formula (I)

where D is a cationic dye moiety; and $R^1$, $R^2$, $R^3$, and $R^4$ are the same or different and selected from the group consisting of alkyl, aryl, aralkyl, alkaryl, alkenyl, alkynyl, alicyclic, heterocyclic, and allyl groups.

3. The imaging process of claim 2 wherein said cationic dye is selected from the group consisting of cationic methine, polymethine, triarylmethane, indoline, azine, thiazine, xanthene, oxazine, and acridine dyes.

4. The imaging process of claim 3 wherein at least one of $R^1$, $R^2$, $R^3$, and $R^4$ is an alkyl group.

5. The imaging process of claim 1 wherein said ionic dye-reactive counter ion compound is an anionic dye compound.

6. The imaging process of claim 5 wherein said anionic dye is selected from the group consisting of xanthene and oxonol dyes.

7. The imaging process of claim 5 wherein said ionic dye counter ion compound is an anionic dye onium ion complex.

8. A thermal recording material comprising a support having a layer of microcapsules on one surface thereof, said microcapsules containing an internal phase including an image-forming agent and a composition which is hardened upon exposure to a combination of heat and light or ultraviolet radiation but which is not hardened upon exposure to either heat or light alone, said composition comprising a free radical addition polymerizable or crosslinkable compound and an ionic dye-reactive counter ion compound, said ionic dye-reactive counter ion compound being capable of absorbing light and producing free radicals which initiate free radical polymerization or crosslinking of said polymerizable or crosslinkable material in the presence of heat.

9. The thermal recording material of claim 8 wherein ionic dye-reactive counter ion compound is a cationic dye-borate anion complex represented by the formula (I)

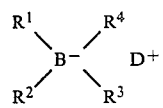

where D is a cationic dye moiety; and $R^1$, $R^2$, $R^3$, and $R^4$ are the same or different and selected from the group consisting of alkyl, aryl, aralkyl, alkaryl, alkenyl, alkynyl, alicyclic, heterocyclic, and allyl groups.

10. The thermal recording material of claim 9 wherein said cationic dye is selected from the group consisting of cationic methine, polymethine, triarylmethane, indoline, azine, thiazine, xanthene, oxazine, and acridine dyes.

11. The thermal recording material of claim 10 wherein at least one of $R^1$, $R^2$, $R^3$, and $R^4$ is an alkyl group.

12. The thermal recording material of claim 11 wherein said ionic dye-reactive counter ion compound is an anionic dye compound.

13. The thermal recording material of claim 12 wherein said anionic dye is selected from the group consisting of xanthene and oxonol dyes.

14. The thermal recording material of claim 13 wherein said ionic dye counter ion compound is an anionic dye onium ion complex.

* * * * *